(12) United States Patent
Chen et al.

(10) Patent No.: US 9,209,603 B2
(45) Date of Patent: Dec. 8, 2015

(54) LASER WITH FULL C-BAND TUNABILITY AND NARROW LINEWIDTH

(71) Applicant: Futurewei Technologies, Inc., Plano, TX (US)

(72) Inventors: Hongmin Chen, Davis, CA (US); Hongbing Lei, San Jose, CA (US); Xiao Shen, San Bruno, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/284,174

(22) Filed: May 21, 2014

(65) Prior Publication Data

US 2014/0348187 A1    Nov. 27, 2014

Related U.S. Application Data

(60) Provisional application No. 61/825,590, filed on May 21, 2013.

(51) Int. Cl.
*H01S 3/10* (2006.01)
*H01S 5/125* (2006.01)
(Continued)

(52) U.S. Cl.
CPC .............. *H01S 5/125* (2013.01); *H01S 5/042* (2013.01); *H01S 5/0612* (2013.01); *H01S 5/06256* (2013.01); *H01S 5/1007* (2013.01); *H01S 5/1028* (2013.01); *H01S 5/124* (2013.01);
(Continued)

(58) Field of Classification Search
CPC ..... H01S 5/042; H01S 5/0612; H01S 5/1209; H01S 5/124; H01S 5/1028; H01S 5/141; H01S 5/3013; H01S 5/06256; H01S 5/1007; H01S 5/125

USPC ...................................... 372/20, 50.1, 98, 99
See application file for complete search history.

(56) References Cited

U.S. PATENT DOCUMENTS

2005/0129361 A1*  6/2005  Kim et al. ..................... 385/37
2005/0141582 A1*  6/2005  Lee et al. ...................... 372/84
(Continued)

FOREIGN PATENT DOCUMENTS

GB          2448162 A     10/2008

OTHER PUBLICATIONS

Wesstrom, J., et al., "Design of a Widely Tunable Modulated Grating Y-branch Laser using the Additives Vernier Effect for Improved Super-Mode Selection," IEEE 18th International Semiconductor Laser Conference, Sep. 29, 2002, pp. 99-100.
(Continued)

*Primary Examiner* — Yuanda Zhang
(74) *Attorney, Agent, or Firm* — Conley Rose, P.C.; Grant Rodolph; Jonathan K. Polk

(57) ABSTRACT

A laser comprises a front mirror (FM), a gain section coupled to the FM, a phase section coupled to the gain section such that the gain section is positioned between the phase section and the FM, and a back mirror (BM) comprising an interferometer and coupled to the phase section such that the phase section is positioned between the BM and the gain section. A method comprises splitting a first light into a second light and a third light, reflecting the second light to form a second reflected light, reflecting the third light to form a third reflected light, and causing the second reflected light and the third reflected light to interfere and combine to form a combined light to narrow a reflectivity peak spectrum width.

20 Claims, 10 Drawing Sheets

(51) Int. Cl.
*H01S 5/042* (2006.01)
*H01S 5/06* (2006.01)
*H01S 5/12* (2006.01)
*H01S 5/14* (2006.01)
*H01S 5/30* (2006.01)
*H01S 5/0625* (2006.01)
*H01S 5/10* (2006.01)

(52) U.S. Cl.
CPC ............... *H01S5/1209* (2013.01); *H01S 5/141* (2013.01); *H01S 5/3013* (2013.01)

(56) References Cited

U.S. PATENT DOCUMENTS

2009/0092159 A1    4/2009    Kato
2010/0142567 A1*    6/2010    Ward et al. ...................... 372/20
2012/0195332 A1*    8/2012    Yoffe et al. ...................... 372/20

OTHER PUBLICATIONS

Foreign Communication From a Counterpart Application, PCT Application No. PCT/US2014/039010, International Search Report dated Aug. 4, 2014, 6 pages.

Foreign Communication From a Counterpart Application, PCT Application No. PCT/US2014/039010, Written Opinion dated Aug. 4, 2014, 8 pages.

Coldren, L., "Diode Lasers and Photonic Integrated Circuits," Second Edition, Wiley Series in Microwave and Optical Engineering, Copyright 2012, 747 pages.

Jayaraman, et al., "Theory, Design, and Performance of Extended Tuning Range Semiconductor Lasers with Sampled Gratings," IEEE Journal of Quantum Electronics, vol. 29, No. 6, Jun. 1993, pp. 1824-1834.

* cited by examiner ly with the accompanying drawings and claims.

LASER WITH FULL C-BAND TUNABILITY AND NARROW LINEWIDTH

CROSS-REFERENCE TO RELATED APPLICATIONS

This application claims priority to U.S. provisional patent application No. 61/825,590 filed May 21, 2013 by Hongmin Chen, et al., and titled "Method and Apparatus for Achieving a Full C-Band Tunability and Narrow Line-Width Laser," which is incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A passive optical network (PON) is one system for providing network access over "the last mile." A PON is a point-to-multipoint network comprised of an optical line terminal (OLT) at a central office (CO), an optical distribution network (ODN), and a plurality of optical network units (ONUs) at the user premises. PONs may also comprise remote nodes (RNs) located between the OLTs and ONUs, for instance at the end of a road where multiple users reside.

In recent years, time-division multiplexing (TDM) PONs, such as Gigabit PONS (GPONs) and Ethernet PONs (EPONs), have been deployed worldwide for multimedia applications. In TDM PONs, the total capacity is shared among multiple users using a time-division multiple access (TDMA) scheme, so the average bandwidth for each user may be limited to below 100 megabits per second (Mbps).

Wavelength-division multiplexing (WDM) PONs are considered a very promising solution for future broadband access services. WDM PONs can provide high-speed links with dedicated bandwidth up to 10 gigabits per second (Gbps). In a WDM PON, each ONU is served by a dedicated wavelength channel to communicate with the central office or the OLT.

One type of WDM is dense WDM (DWDM). DWDM may combine along a single optical fiber multiple optical signals at various wavelengths. DWDM PONs may provide additional bandwidth, but may also require the use of tunable lasers, which may refer to lasers that may be tuned to emit laser beams at specific wavelengths. Those specific wavelengths may be in the C band, which may refer to wavelengths in the range of 1,528 nanometers (nm) to 1,565 nm. It is therefore desirable to design such tunable lasers in a high-performance manner.

SUMMARY

In one embodiment, the disclosure includes a laser comprising a front mirror (FM), a gain section coupled to the FM, a phase section coupled to the gain section such that the gain section is positioned between the phase section and the FM, and a back mirror (BM) comprising an interferometer and coupled to the phase section such that the phase section is positioned between the BM and the gain section.

In another embodiment, the disclosure includes a laser comprising an FM and a BM indirectly coupled to the FM and configured to split a first light into a second light and a third light, reflect the second light to form a second reflected light, reflect the third light to form a third reflected light, and cause the second reflected light and the third reflected light to interfere and combine to form a combined light to narrow a reflectivity peak spectrum width of the BM and allow the laser to emit a laser beam at a selected wavelength.

In yet another embodiment, the disclosure includes a method comprising splitting a first light into a second light and a third light, reflecting the second light to form a second reflected light, reflecting the third light to form a third reflected light, and causing the second reflected light and the third reflected light to interfere and combine to form a combined light to narrow a reflectivity peak spectrum width.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Since their inception, monolithically-integrated tunable laser sources (MI-TLSs) have been widely used in optical communications. Monolithic integration may mean that all optical components of a device are integrated onto a single substrate. Generally, an MI-TLS may be fabricated on an indium phosphide (InP) substrate by butt-joining of a gain section and a passive section. In this context, butt joining may refer to growing a gain section, etching away a portion of the gain section, and growing a passive section in the etched away portion. The gain section may have a lower band gap at a target lasing wavelength and provide gain through current injection. Cavity mirrors may be fabricated in the passive section and provide wavelength tuning.

To provide full C-band tunability, meaning the ability to tune wavelengths from at least 1,528 nm to 1,565 nm, the Vernier effect of two or more mirrors with comb reflection spectra may be used. The Vernier effect is a well-known technique for extending the tuning range of widely tunable lasers containing two reflectors with a different grating period, causing a slightly different peak spacing in the reflection spectrum. The Vernier effect may be used to reduce the required wavelength tuning range of individual mirrors. A comb reflection spectrum may refer to a reflection, or reflectivity, spectrum comprising a series of discrete, equally-spaced maxima, which may or may not vary in amplitude. Mirrors with comb reflection spectra may be referred to as comb reflectors (CRs). Wavelength tuning is typically achieved by current injection or temperature adjustment.

Figure 1:
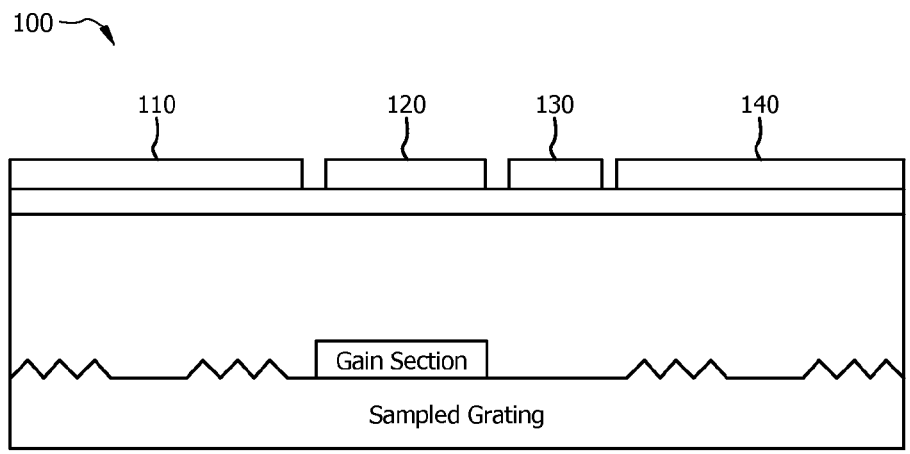
FIG. 1 is a schematic diagram of a tunable sampled grating distributed Bragg reflector (SGDBR) laser.

FIG. 1 is a schematic diagram of a tunable sampled grating distributed Bragg reflector (SGDBR) laser 100. The laser 100 may be the same as the laser provided in Vijaysekhar Jayaraman, et al., "Theory, Design, and Performance of Extended Tuning Range Semiconductor Lasers with Sampled Gratings," IEEE Journal of Quantum Electronics, Vol. 29, No. 6, June 1993, which is incorporated by reference. The laser 100 may comprise an FM 110, a gain section 120, a phase or passive section 130, and a BM 140. The FM 110 and the BM 140 may both be sampled gratings with comb reflection spectra, but different comb spacing. A grating may refer to an optical component with a periodic structure that splits and diffracts light into different beams traveling in different directions. A sampled grating may refer to a grating with grating elements removed in a periodic fashion. The components of the laser 100 may define a cavity. The gain section 120 may generate a light, and certain wavelengths may oscillate within the cavity while other wavelengths may be suppressed. Eventually, the laser 100 may emit a laser beam from the left side of the laser 100 along a plane of the page.

Figure 2:
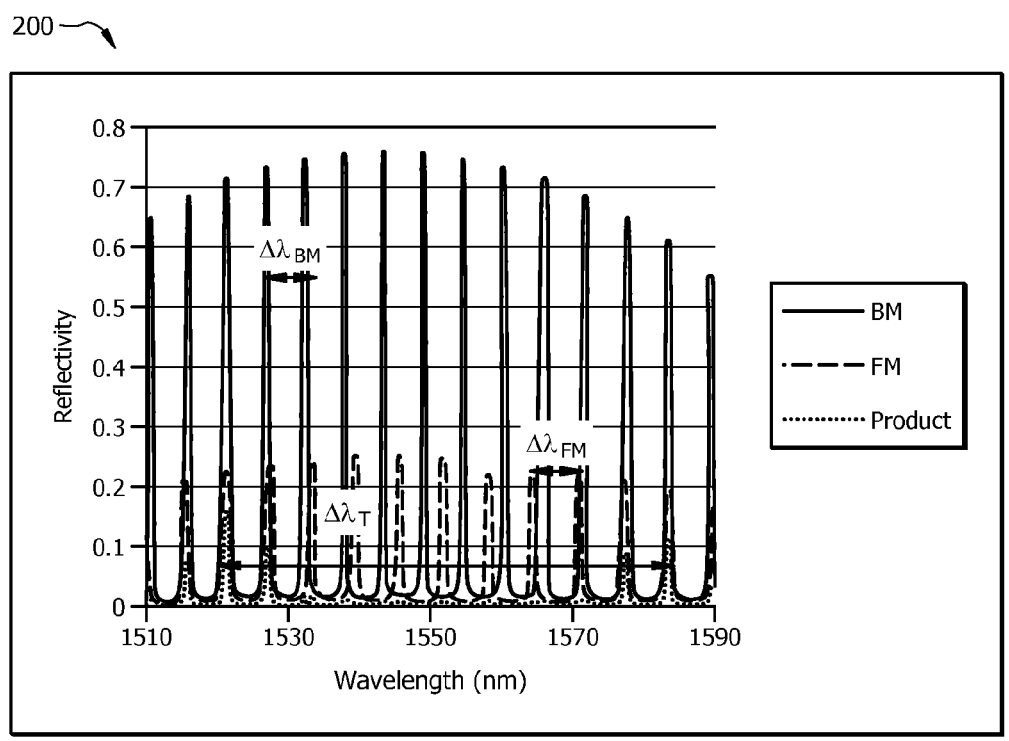
FIG. 2 is a graph of wavelength versus reflectivity for the laser in FIG. 1

FIG. 2 is a graph 200 of wavelength versus reflectivity for the laser 100 in FIG. 1. As shown, the x-axis represents wavelength in nanometers (nm), and the y-axis represents reflectivity as constants or arbitrary units. The reflectivity of the FM 110 is represented by a dashed line, the reflectivity of the BM 140 is represented by a solid line, and the product of the two reflectivities is represented by a dotted line. The cavity mirror loss of the laser 100 is equal to that product. The FM 110 reflectivity spectrum may comprise maxima that are equally spaced apart by an amount equal to $\Delta\lambda_{FM}$, and the BM 140 reflectivity spectrum may comprise maxima that are equally spaced apart by an amount equal to $\Delta\lambda_{BM}$. $\Delta\lambda_{FM}$ and $\Delta\lambda_{BM}$ may refer to the comb spacing of the FM 110 and the BM 140, respectively. As can be seen, the maxima form a pattern that looks like a common hair comb. The maxima of the product, or where maxima of the FM 110 reflectivity and the BM 140 reflectivity align, may be where a laser beam may exit the laser 100. A tuning range, $\Delta\lambda_T$, of the laser 100 may represent the wavelength range between two maxima of the product and may be expressed as follows:

$$\Delta\lambda_T = \frac{\Delta\lambda_{FM}\Delta\lambda_{BM}}{|\Delta\lambda_{FM} - \Delta\lambda_{BM}|}. \quad (1)$$

In the graph 200, $\Delta\lambda_{FM}$ may be 6.16 nm and $\Delta\lambda_{BM}$ may be 5.63 nm. Using equation 1, $\Delta\lambda_T$ may be calculated as 65.44 nm. The laser 100 may emit a laser beam at any wavelength within the tuning range by aligning a reflectivity maximum of the FM 110 and a reflectivity maximum of the BM 140 to that wavelength. Instead of the whole tuning range, $\Delta\lambda_T$, a maximum required tuning of the FM 110 is $\Delta\lambda_{FM}$ and a maximum required tuning of the BM 140 is $\Delta\lambda_{BM}$.

A tunable laser with narrow linewidth may be required for optically coherent communication as a light source in a transmitter or as a local oscillator in a receiver. In this context, coherence may mean that light waves at different frequencies interfere to form a pulse if they have a fixed relative phase relationship. In contrast, incoherence may mean that light waves at different frequencies interfere to form a wave that is continuous in time (e.g., as in white light). In this context, linewidth may refer to the spectral linewidth of a laser beam and may be expressed as follows:

$$\Delta v_{STH} = \frac{c^2 \eta_{sp}(\alpha_i + \alpha_m)^2 e(1 + \alpha_H^2)}{\eta_g^2 \eta_i (I - I_{th})} \left(\frac{\eta_g L_g}{\eta_g L_g + \eta_p L_p}\right)^2, \quad (2)$$

where the following variable definitions apply:
  $\Delta v_{STH}$: linewidth
  c: speed of light in a vacuum
  $\eta_{sp}$: spontaneous emission factor
  $\alpha_i$: internal loss of gain waveguide
  $\alpha_m$: effective mirror loss
  $\alpha_H$: line width enhancement factor of gain material
  $\eta_g$: group refractive index for gain waveguide
  $\eta_i$: current injection efficiency
  I: injection current without considering roll over
  $I_{th}$: threshold current below which no light emits
  $I-I_{th}$: operating current
  $L_g$: length of gain section
  $\eta_p$: group refractive index for passive waveguide
  $L_p$: effective length of passive section.
The effective mirror loss, $\alpha_m$, may be expressed as follows:

$$\alpha_m = \frac{-1}{2L_g} \ln(R_{FM_{eff}} R_{BM_{eff}}), \quad (3)$$

where the following variable definitions apply:
  $R_{FM\_eff}$: effective reflectivity of FM 110
  $R_{BM\_eff}$: effective reflectivity of BM 140.
Though the actual length of the gain section may be used, $L_p$, the effective length of the passive section may instead be used because, for many types of wavelength selective reflectors such as distributed Bragg reflectors (DBRs), the effective optical path length does not equal the actual device size because the light is reflected back in a distributed manner. As can be seen from equation 2, the linewidth, $\Delta v_{STH}$, is inversely proportional to the length of the gain section, $L_g$, and the effective length of the passive section, $L_p$; thus, the linewidth may be reduced by increasing the length of the gain section and increasing the effective length of the passive section. The length of the gain section, however, generally may be no less than 500 micrometers (μm) because a shorter gain section length may result in LI rollover at a smaller current, which may limit the maximum injection current to the gain section and limit output power. LI may refer to a curve of laser injection current versus output power. Rollover may refer to the point of the curve where peak output power begins to decrease as injection current increases. A better approach to reducing linewidth is therefore to increase the effective length of the passive section like in an external cavity laser.

Figure 3:
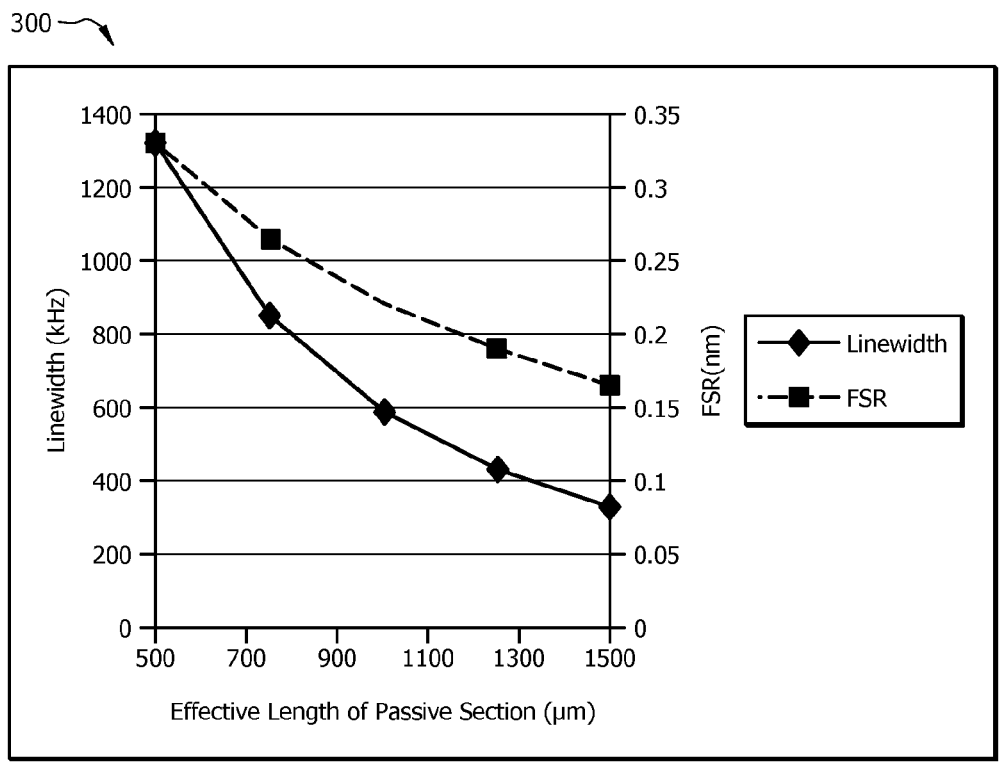
FIG. 3 is a graph of passive section effective length versus linewidth and free spectral range (FSR) for the laser in FIG. 1.

FIG. 3 is a graph 300 of passive section effective length versus linewidth and FSR for the laser 100 in FIG. 1. FSR may also be referred to as cavity mode spacing and may refer to the spacing in frequency or wavelength between two successive reflected optical intensity maxima or minima. As shown, the x-axis represents the effective length of the passive section 130 in micrometers, and the y-axes represent linewidth in kilohertz (kHz) and FSR in nanometers. Linewidth is represented by a solid line, and FSR is represented by a dashed line. The parameters for the laser 100 used for calculating the graph 300 may be as shown in Table 1.

TABLE 1

Parameters of the laser 100

| Parameter | Value |
|---|---|
| c | 2.99792458 × 10⁸ meters per second (m/s) |
| $\eta_{sp}$ | 1.75 |
| $\alpha_i$ | 10 centimeters⁻¹ (cm⁻¹) |
| $\alpha_m$ | 18.33 cm⁻¹ |
| $\eta_g$ | 3.63 |
| $\eta_i$ | 0.8 |
| I-$I_{th}$ | 90 (amperes) |
| $L_g$ | 500 micrometers (μm) |
| $\eta_p$ | 3.63 |
| $\alpha_H$ | 4 |
| $L_a$ | |
| $R_{FM_{eff}}$ | 20% |
| $R_{BM_{eff}}$ | 80% |
| e | 1.60 × e⁻¹⁹ coulombs (C) |

As can be seen from the graph 300, increasing the effective length of the passive section 130 may reduce both linewidth and FSR.

Another parameter of the laser 100 may be SMSR. SMSR may refer to the relation of power between a center peak longitudinal mode and a nearest higher-order mode. For the laser 100, the worst SMSR may occur either at a cavity mode within a super mode or at a neighboring mode, which may refer to a cavity mode neighboring a main mode.

Figure 4:
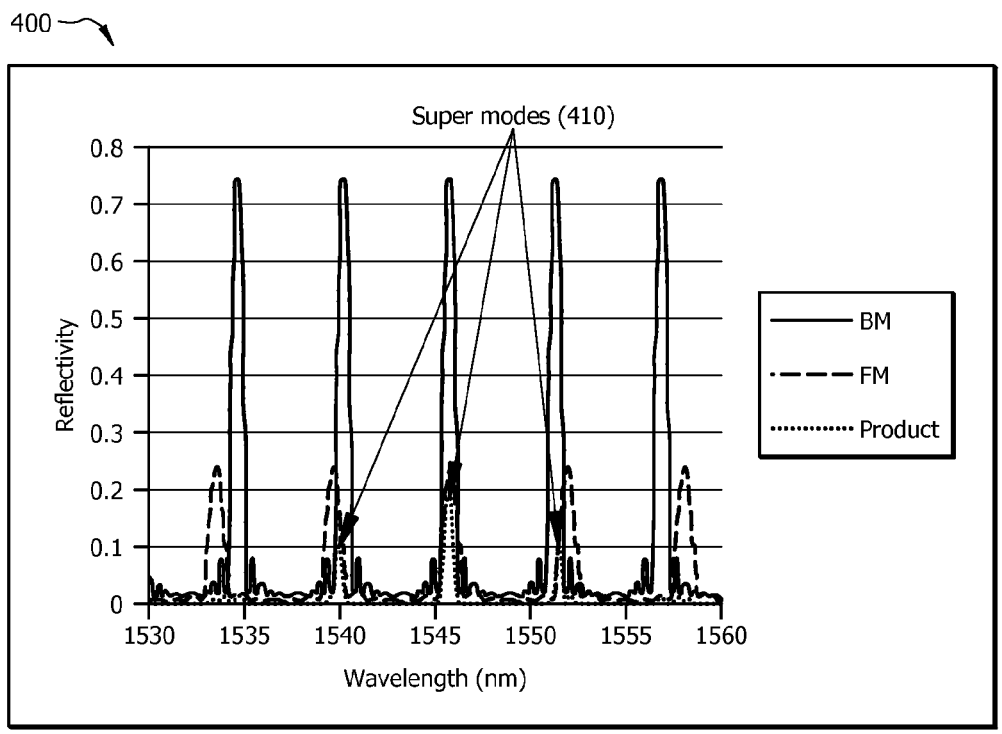
FIG. 4 is a graph showing the super modes of the laser of FIG. 1.

FIG. 4 is a graph 400 showing the super modes of the laser 100 of FIG. 1. As shown, the x-axis represents wavelength in nanometers, and the y-axis represents reflectivity as constants or arbitrary units. The reflectivity of the FM 110 is represented by a dashed line, the reflectivity of the BM 140 is represented by a solid line, and the product of the two reflectivities is represented by a dotted line. The graph 400 may comprise super modes 410, which may be the product maxima. The SMSR of the super modes may be determined by the width and spacing of those product maxima.

Figure 5:
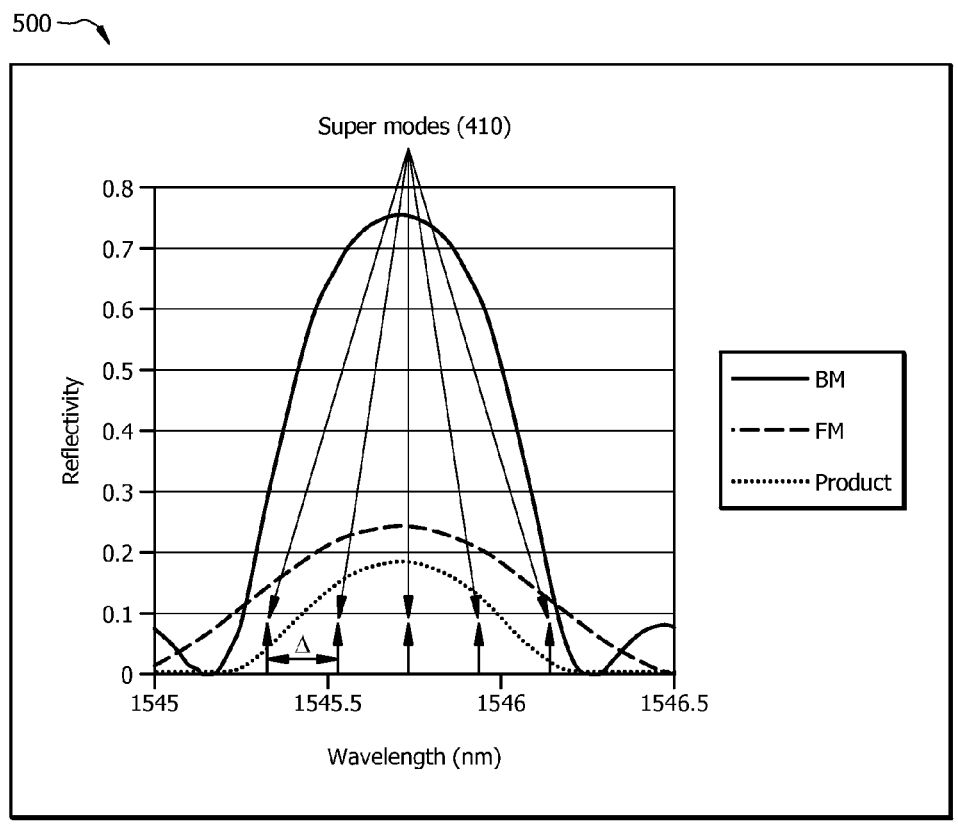
FIG. 5 is a graph showing the neighboring modes of the laser of FIG. 1.

FIG. 5 is a graph 500 showing the neighboring modes of the laser 100 of FIG. 1. As shown, the x-axis represents wavelength in nanometers, and the y-axis represents reflectivity as constants or arbitrary units. The reflectivity of the FM 110 is represented by a dashed line, the reflectivity of the BM 140 is represented by a solid line, and the product of the two reflectivities is represented by a dotted line. The graph 500 may comprise cavity modes 510. The graph 500 may also comprise a main mode, which may correspond to the only product in the graph 500, which may also correspond to the highest super mode 410 in the graph 400 of FIG. 4. Returning to FIG. 5, the neighboring modes may correspond to the cavity mode 510 on the far left and the cavity mode 510 on the far right. The spacing between each of the cavity modes 510 is shown as Δ in the graph 500 and may be referred to as the cavity mode spacing or FSR. The SMSR of the neighboring modes may be determined by the FSR and the width of the main mode.

The FSR may be expressed as follows:

$$FSR = \frac{\lambda^2}{2(\eta_g L_g + \eta_p L_p)}, \quad (4)$$

where λ is a lasing wavelength. As can be seen from equation 4 as well as FIG. 3, the FSR is inversely proportional to the length of the gain section 120 and the effective length of the passive section 130. Consequently, while increasing the effective length of the passive section 130 may reduce the linewidth, it may also reduce the FSR, which may degrade the SMSR of the laser 100 unless the widths of the reflectivity spectra of the FM 110 and the BM 140 are sufficiently narrow.

Figure 6:
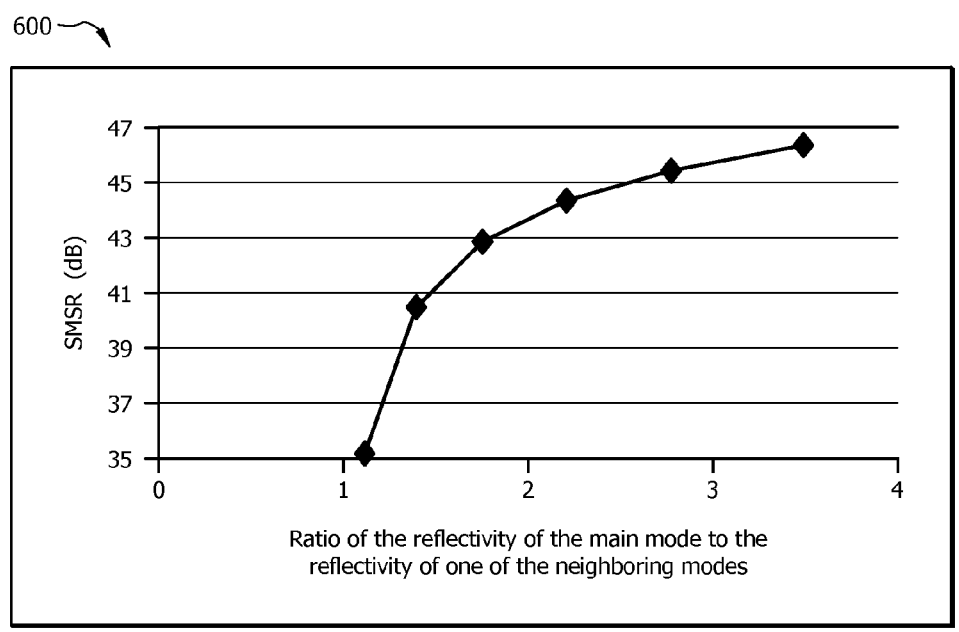
FIG. 6 is a graph showing the side-mode suppression ratio (SMSR) of the laser of FIG. 1.

FIG. 6 is a graph 600 showing the SMSR of the laser 100 of FIG. 1. As shown, the x-axis represents the ratio of the reflectivity of the main mode to the reflectivity of one of the neighboring modes, and the y-axis represents SMSR in decibels (dB). The graph 600 may be derived based on the values in Table 1 and the following equation:

$$SMSR \approx 10\log_{10}\left(1 + \frac{\Delta\alpha_m + \Delta g}{\delta_G}\right), \quad (5)$$

where the following variable definitions apply:
Δg: modal gain margin
$\delta_G$: separation between the mirror loss and the net modal gain for the main mode.
Equation 5 is provided in Larry A. Coldren, et al., "Diode Lasers and Photonic Integrated Circuits, 2nd Edition, 2012 ("Coldren"), which is incorporated by reference. As suggested in Coldren, $\delta_G$ may be calculated as follows:

$$\delta_G \sim \frac{1e^{-3}I_{th}}{I - I_{th}}, \quad (6)$$

where I-$I_{th}$=3.5$I_{th}$. As can be seen from FIG. 6, as the ratio of the reflectivity of the main mode to the reflectivity of one of the neighboring modes increases, the SMSR also increases. In summary, to make a high-performing tunable laser, it may be suitable to 1) increase the effective length of the passive section 140 in order to reduce the linewidth, and 2) reduce the spectrum width of the product of the reflectivity of the FM 110 and the reflectivity of the BM 140 to maintain the SMSR.

The spectrum width of the product may be reduced by reducing either the reflectivity of the FM 110 or the reflectivity of the BM 140.

Disclosed herein is an improved tunable laser. The laser may focus on reducing a reflectivity spectrum width of a BM, thus allowing an increase of an effective length of a passive section to reduce a linewidth without degrading an SMSR. Specifically, the BM may combine a reflected light from a CR and a reflected light from a flat, high-reflection-coated (HR-coated) mirror along a delay line. The two reflected lights may interfere and narrow a reflectivity peak spectrum width of the BM. The narrow reflectivity peak spectrum width from the BM may provide for an increase in the effective length of the passive section, which may provide for a reduction in a linewidth without sacrificing the SMSR. The laser may therefore achieve full C-band tunability and sub-megahertz (MHz) narrow linewidth in an MI-TLS fashion. The laser may be used in DWDM systems as light sources for long-haul transmitters that transmit over many kilometers (km), for instance between two COs, or in other suitable manners.

Figure 7:
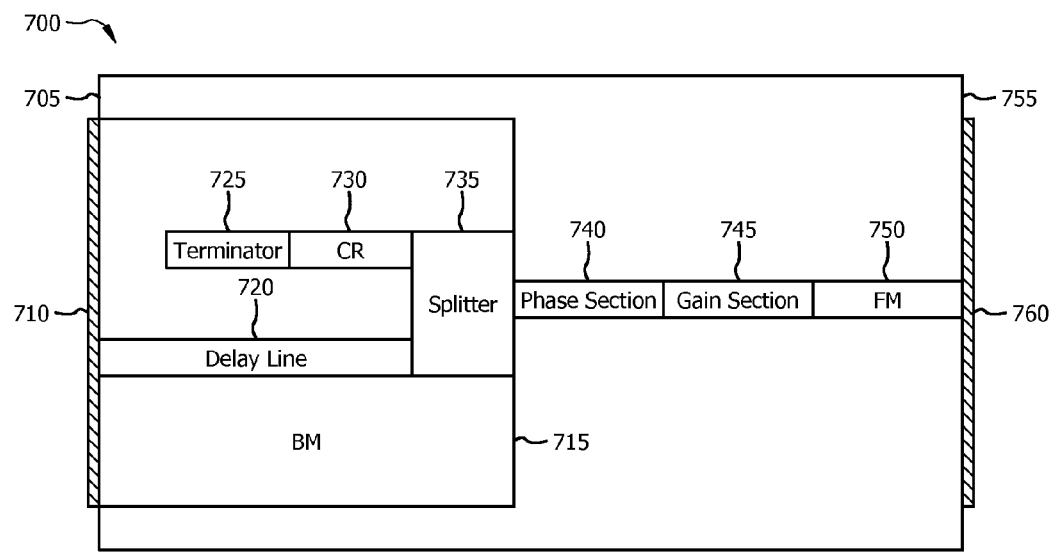
FIG. 7 is a schematic diagram of a laser according to an embodiment of the disclosure.

FIG. 7 is a schematic diagram of a laser chip 700 according to an embodiment of the disclosure. The chip 700 may comprise a back facet 705 comprising an HR coating 710, a BM 715, a phase section 740, a gain section 745, an FM 750, and a front facet 755 comprising an anti-reflection (AR) coating 760. The components may be arranged as shown or in any other suitable manner (e.g., components may be directly or indirectly coupled). Two components, for instance the phase section 740 and the gain section 745, may be said to be directly coupled if no other components are positioned between them. Two components, for instance the phase section 740 and the FM 750, may be said to be indirectly coupled if at least one other component is positioned between them, for instance if the gain section 745 is positioned between them. The components of the chip 700 may define a cavity. The gain section 745 may generate a light, and certain wavelengths may oscillate within the cavity while other wavelengths may be suppressed. The chip 700 may then emit a laser beam from the front facet 755 along a plane of the page.

The phase section 740 may align a cavity mode to a reflectivity spectrum peak defined by the BM 715 and the FM 750. The phase section 740 may also provide fine control of a wavelength through local temperature change or current injection. The phase section 740 may comprise any materials suitable for providing those functions.

The gain section 745 may provide optical gain through current injection tuning. The gain section 745 may comprise any materials suitable for providing that function. For instance, the gain section 745 may comprise group III-V compounds such as indium gallium arsenide phosphide (InGaAsP) or indium gallium aluminum arsenide (InGaAlAs).

The FM 750 may be a CR. The FM 750 may provide reflectivity spectrum maxima tunable by local temperature tuning or current injection tuning. The FM 750 may comprise any materials suitable for providing those functions.

The AR coating 760 may eliminate unwanted reflection. The AR coating 760 may comprise any materials suitable for anti-reflection (e.g., less than or equal to about 0.1% reflection). The AR coating 760 may or may not be formed across the entire length of the front facet 755.

The BM 715 may comprise a splitter 735, a delay line 720, a CR 730, and a terminator 725. The BM may comprise or function as an interferometer, and thus be referred to as an interferometer. An interferometer may refer to a device that causes two or more waves to interfere and combine into a single wave that has a meaningful property. The interferometer function is described more fully below with respect to the components of the BM 715 and the interaction of the components of the BM 715. The BM 715 may have a narrow reflectivity peak spectrum width, which is discussed further below.

The splitter 735 may be a power splitter and may split light received from the phase section 740 into light to the delay line 720 and light to the CR 730. The splitter 735 may also combine reflected light received from the delay line 720 and reflected light received from the CR 730 into light to the phase section 740. When the reflected lights from the delay line 720 and the CR 730 have the same or substantially same phase, there may be constructive interference between the two reflected lights so that the reflectivity of the combined light is at a peak. When the reflected lights from the delay line 720 and the CR 730 have different phases, there may be destructive interference between the two reflected lights so that the reflectivity of the combined light is not at a peak. The reflected lights from the delay line 720 and the CR 730 may combine and interfere so as to narrow the reflectivity peak spectrum width of the BM 715. In this context, narrow may be a relative term meaning that the reflectivity peak spectrum width is narrower when employing the delay line 720 and the CR 730 than when using the CR 730 or any CR alone. A narrow reflectivity peak spectrum width may also mean a reflectivity peak spectrum width of 0.6 nanometers or less. The splitter 735 may be a 1×2 multi-mode interference (MMI) device, a 2×2 MMI device, a directional coupler, a Y-branch splitter, or another suitable device. The splitting ratio may be 50:50 or any suitable ratio.

The delay line 720 may guide light from the splitter 735 to the back facet 705, where the light may reflect off of the HR coating 710. The delay line 720 may then guide the reflected light from the back facet 705 back and the HR coating 710 to the splitter 735. A phase of the reflected light may be adjusted by current injection tuning or local temperature tuning. The length and the phase of the delay line 720 may be adjusted so that a desired wavelength has constructive interference between reflections of the CR 730 and the delay line 720 and so that the BM 715 maintains a flat comb property. Specifically, the length of the delay line 720 may be chosen in a way that the optical path length difference between the delay line 720 and the effective length of the CR 730 is a multiple integer of the sampling period so that, when constructive interference between the CR 730 and the delay line 720 reflector occurs for one peak by adjusting the phase of the delay line 720, the constructive interference also occurs with other peaks of the CR 730. The length of the delay line may be about 200 μm to 400 μm longer than an effective length of the CR 730.

The HR coating 710 may reflect light from the delay line 720 and thus provide part of the reflectivity for the BM 715. The HR coating 710 may comprise any materials suitable for high reflection (e.g., greater than or equal to about 90% reflection). The HR coating 710 may or may not be formed across the entire length of the back facet 705.

The CR 730, as implied by the name, may provide reflectivity with a comb spectrum. The maxima of the spectrum may be adjusted by current injection tuning or local temperature tuning. The CR 730 may be an SGDBR, a phase grating DBR, a ring resonator, or another suitable device that provides two or more reflection maxima.

The terminator 725 may follow the CR 730 and prevent unwanted reflection from the back facet 705 to the CR 730. The terminator 725 may be formed by a butt-joint of gain section material; growth of another absorption material such as indium gallium arsenide (InGaAs), which may have high absorption loss (e.g., less than or equal to about 0.1% reflection) when there is no current injection; a curved waveguide towards the back facet; or terminating the waveguide far away from the back facet 705 so that the reflected light from the back facet 705 does not return to the waveguide. Alternatively, the terminator 725 may be formed by any suitable combination of those methods.

The chip 700 may be referred to as a delayed-line interferometer SGDBR (DLI-SGDBR) if using sampled grating for the CR 730 or as a DLI phase grating DBR (DLI-PGDBR) if using phase grating for the CR 730. The components of the chip 700 may comprise waveguide materials. With the exception of the waveguide materials for the gain section 745 and the terminator 725, the waveguide materials may comprise low-loss materials such as indium gallium arsenide phosphide ($Ga_xIn_{1-x}As_yP_{1-y}$) or other suitable materials with high band gap.

Following are modeled performance characteristics of the chip 700. The models may assume an SGDBR CR 730, though the principles may also apply to other CRs 730 with two or more reflection peaks such as PGDBRs and ring resonators. The parameters for the HR coating 710, the delay line 720, and the splitter 735 may be as shown in Table 2.

TABLE 2

Parameters for the HR coating 710, the delay line 720, and the splitter 735

| Parameter | Value |
| --- | --- |
| Splitting ratio | 50:50 |
| Length of the delay line 720 | 676 μm |
| $\eta_0$ (effective index) | 3.26 at 1,550 nm |
| $dn/d\lambda$ (slope of effective index versus wavelength) | $-0.00035$ $nm^{-1}$ |
| Loss | 0.5 $cm^{-1}$ |
| HR reflectivity | 0.95 |

The parameters for the CR 730 may be as shown in Table 3.

TABLE 3

Parameters for the CR 730

| Parameter | Value |
| --- | --- |
| $\Lambda$ (grating pitch) | 236.9632 nm |
| $\eta_0$ (effective index) | 3.26 at 1,550 nm |
| $dn/d\lambda$ (slope of effective index versus wavelength) | $-0.00035$ $nm^{-1}$ |
| K (grating strength) | 400 $cm^{-1}$ |
| $L_b$ (burst window length) | 3.080521 μm |
| $L_p$ (period length) | 56.3 μm |
| $\alpha$ (waveguide loss) | 0.5 $cm^{-1}$ |
| N (number of periods) | 11 |

The parameters for the FM 750 may be as shown in Table 4.

TABLE 4

Parameters for the FM 750

| Parameter | Value |
| --- | --- |
| $\Lambda$ (grating pitch) | 236.9632 nm |
| $\eta_0$ (effective index) | 3.26 at 1,550 nm |
| $dn/d\lambda$ (slope of effective index versus wavelength) | $-0.00035$ $nm^{-1}$ |
| K (grating strength) | 400 $cm^{-1}$ |
| $L_b$ (burst window length) | 1.895706 μm |
| $L_p$ (period length) | 51 μm |
| $\alpha$ (waveguide loss) | 0.5 $cm^{-1}$ |
| N (number of periods) | 7 |

Figure 8:
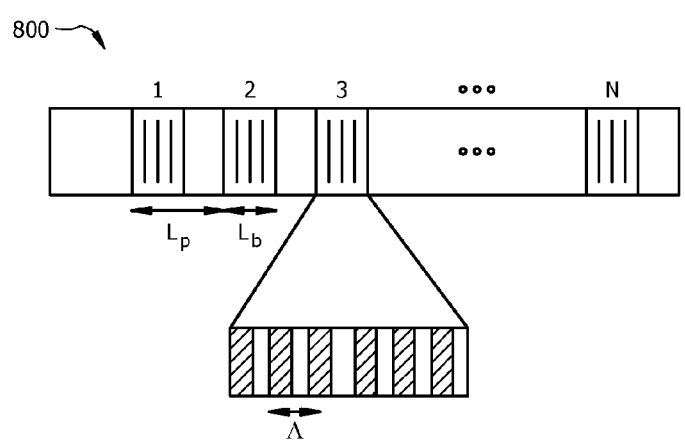
FIG. 8 is a diagram illustrating parameters of the comb reflector (CR) in FIG. 7.

FIG. 8 is a diagram 800 illustrating parameters of the CR 730 in FIG. 7. The diagram 800 may illustrate the SGDBR parameters in Table 3 for the CR 730. Specifically, the diagram 800 may illustrate the relationship of the grating pitch, the burst window length, and the period length.

Figure 9:
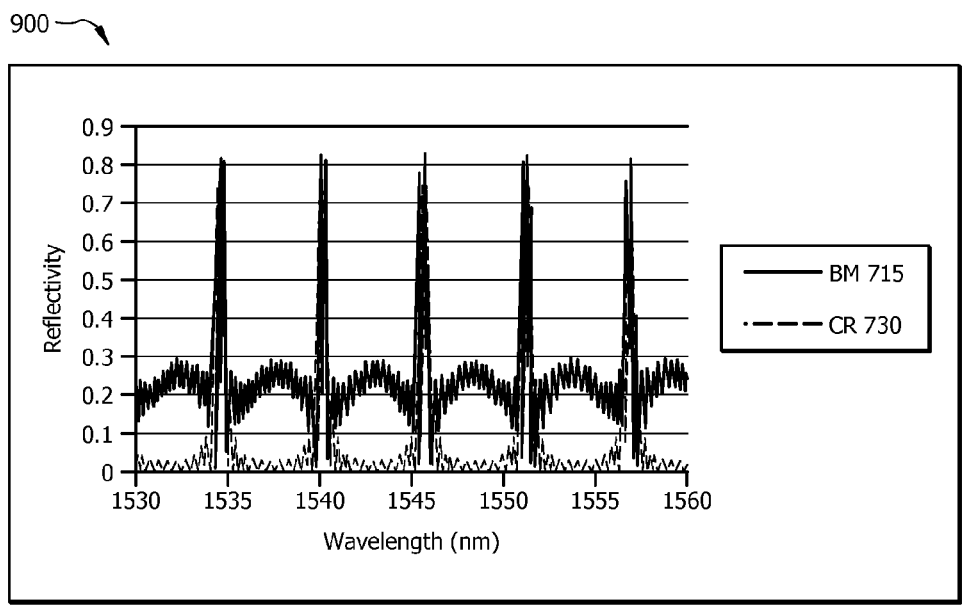
FIG. 9 is a graph of modeled reflectivity spectra for the BM and the CR in FIG. 7.

FIG. 9 is a graph 900 of modeled reflectivity spectra for the BM 715 and the CR 730 in FIG. 7. As shown, the x-axis represents wavelength in nanometers, and the y-axis represents reflectivity as constants or arbitrary units. The reflectivity of the BM 715 is represented by a solid line, and the reflectivity of the CR 730 is represented by a dashed line. As can be seen, the reflectivity peak widths may be narrow. As stated above, the length and the phase of the delay line 720 may be adjusted so that a desired wavelength has constructive interference between reflections of the CR 730 and the delay line 720 and so that the BM 715 maintains a flat comb property.

Figure 10:
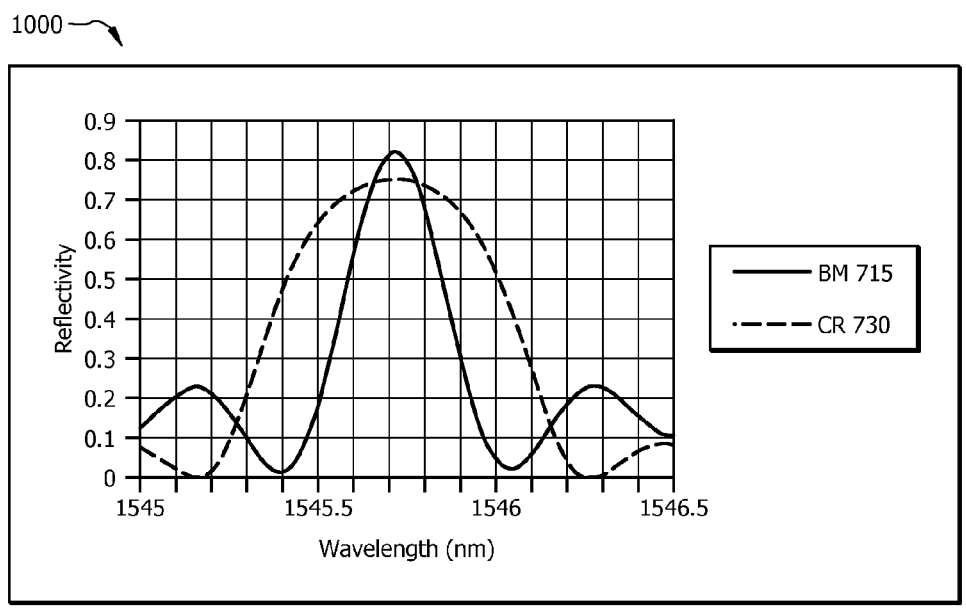
FIG. 10 is a graph of the middle maximum of the reflectivity spectra shown in the graph of FIG. 9.

FIG. 10 is a graph 1000 of the middle maximum of the reflectivity spectra shown in the graph 900 of FIG. 9. Specifically, the graph 1000 may show the maximum from the graph 900 that is between about 1,545.5 nanometers and about 1,546 nanometers. As shown, the x-axis represents wavelength in nanometers, and the y-axis represents reflectivity as constants or arbitrary units. The reflectivity of the BM 715 is represented by a solid line, and the reflectivity of the CR 730 is represented by a dashed line. As can be seen, the full width at half maximum (FWHM) of the BM 715 reflectivity peak spectrum may be reduced more than half compared to when using an SGDBR alone. FWHM may refer to the distance between points on a curve, in this case the BM 715 reflectivity peak spectrum, at which the function reaches half its maximum value. The maximum value of the BM 715 reflectivity may be slightly more than 0.8, so the half maximum may be about 0.4. The BM 715 reflectivity peak spectrum may reach 0.4 at about 1,545.55 nanometers and at about 1,545.85, so the FWHM may be about 0.3 nanometers. The total width of the BM 715 reflectivity peak spectrum may be about 0.6 nanometers.

Figure 11:
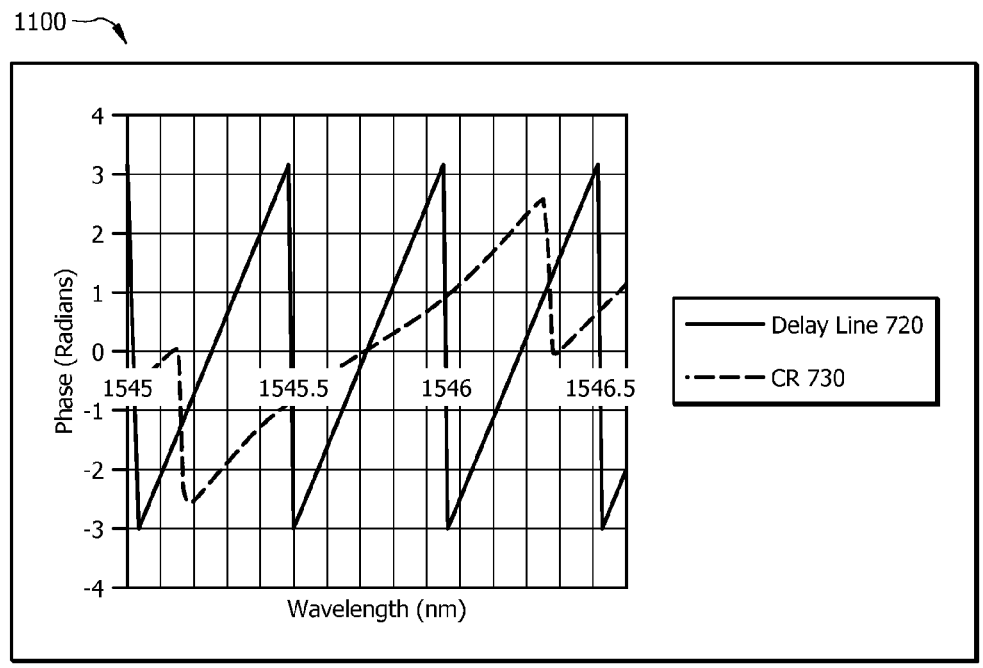
FIG. 11 is a graph of light phase corresponding to the graph in FIG. 10.

FIG. 11 is a graph 1100 of light phase corresponding to the graph 1000 in FIG. 10. As shown, the x-axis represents wavelength in nanometers, and the y-axis represents phase in radians. The phase of the delay line 720 is represented by a solid line, and the phase of the CR 730 is represented by a dashed line. As can be seen by comparing FIG. 11 to FIG. 9, the BM 715 has constructive interference, and thus peak reflectivity, when the phase of the delay line 720 and the CR 730 overlap.

Figure 12:
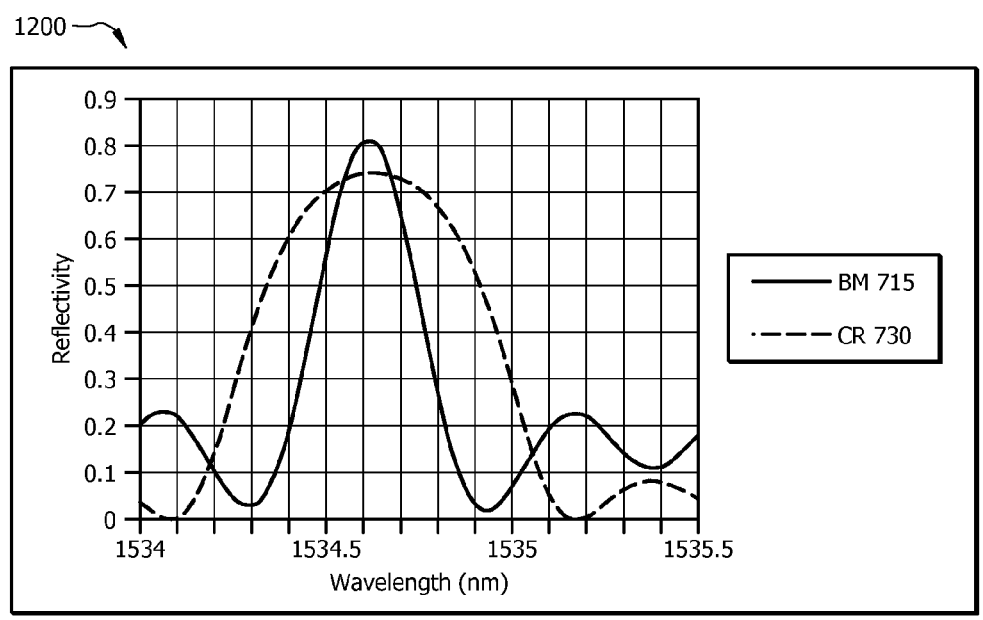
FIG. 12 is a graph of the left-most maximum of the reflectivity spectra shown in the graph in FIG. 9.

FIG. 12 is a graph 1200 of the left-most maximum of the reflectivity spectra shown in the graph 900 in FIG. 9. Specifically, the graph 1200 may show the maximum from the graph 900 that is between about 1,534.3 nanometers and about 1,534.9 nanometers. As shown, the x-axis represents wavelength in nanometers, and the y-axis represents reflectivity as constants or arbitrary units. The reflectivity of the BM 715 is represented by a solid line, and the reflectivity of the CR 730 is represented by a dashed line. As in FIG. 10, the graph 1200 may show that the FWHM of the BM 715 reflectivity peak spectrum may be reduced more than half compared to when using an SGDBR alone and show that the width of the BM 715 reflectivity peak spectrum may be about 0.6 nanometers.

Figure 13:
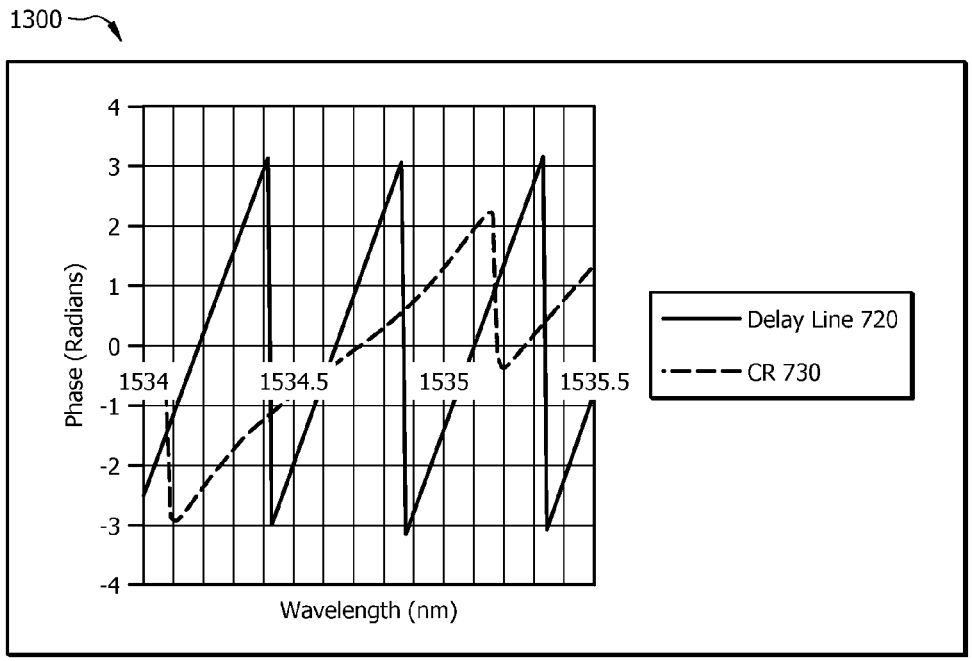
FIG. 13 is a graph of light phase corresponding to the graph in FIG. 12.

FIG. 13 is a graph 1300 of light phase corresponding to the graph 1200 in FIG. 12. As shown, the x-axis represents wavelength in nanometers, and the y-axis represents phase in radians. The phase of the delay line 720 is represented by a solid line, and the phase of the CR 730 is represented by a dashed line. As in FIG. 11, the graph 1300 may show that the BM 715 has constructive interference, and thus peak reflectivity, when the phase of the delay line 720 and the CR 730 overlap.

Figure 14:
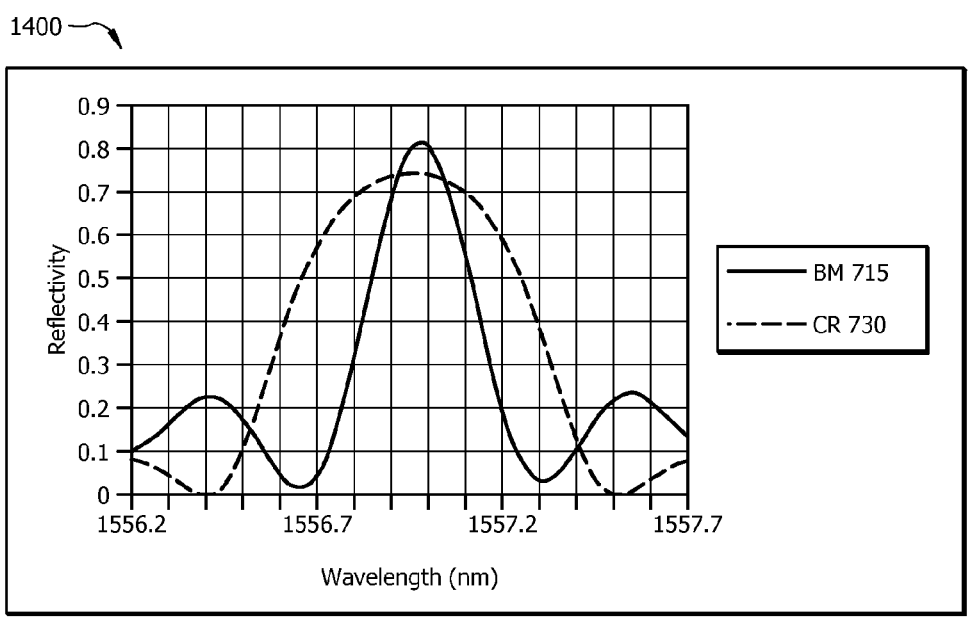
FIG. 14 is a graph of the right-most maximum of the reflectivity spectra shown in the graph in FIG. 9.

FIG. 14 is a graph 1400 of the right-most maximum of the reflectivity spectra shown in the graph 900 in FIG. 9. Specifically, the graph 1400 may show the maximum from the graph 900 that is between about 1,556.7 nanometers and about 1,557.3 nanometers. As shown, the x-axis represents wavelength in nanometers, and the y-axis represents reflectivity as constants or arbitrary units. The reflectivity of the BM 715 is represented by a solid line, and the reflectivity of the CR 730 is represented by a dashed line. As in FIGS. 10 and 12, the graph 1400 may show that the FWHM of the BM 715 reflectivity peak spectrum may be reduced more than half compared to when using an SGDBR alone and show that the width of the BM 715 reflectivity peak spectrum may be about 0.6 nanometers.

Figure 15:
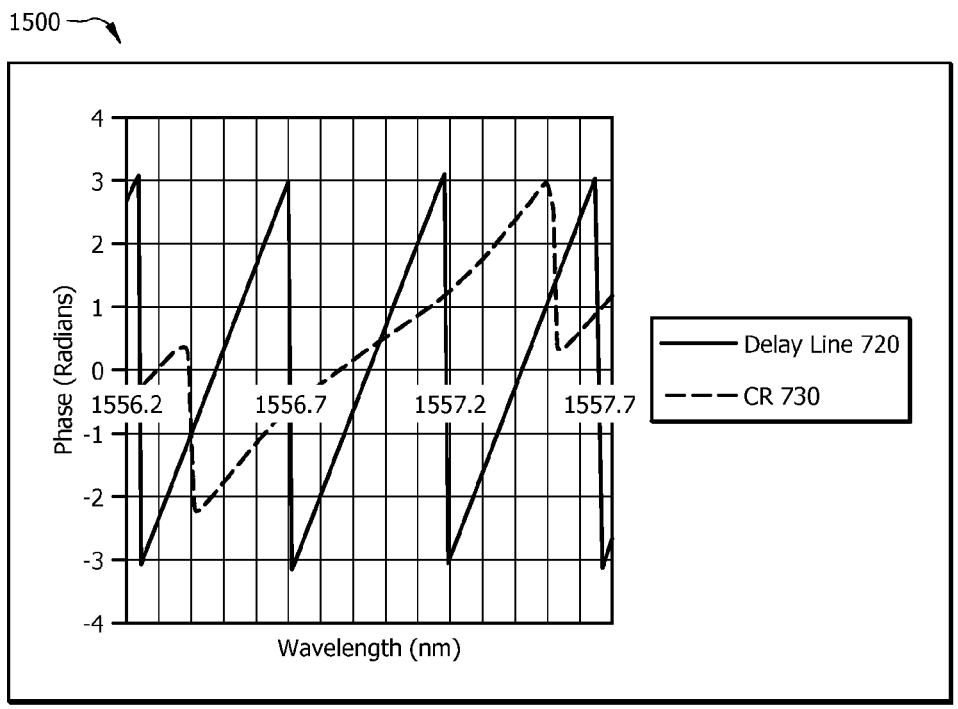
FIG. 15 is a graph of light phase corresponding to the graph in FIG. 14.

FIG. 15 is a graph 1500 of light phase corresponding to the graph 1400 in FIG. 14. As shown, the x-axis represents wavelength in nanometers, and the y-axis represents phase in radians. The phase of the delay line 720 is represented by a solid line, and the phase of the CR 730 is represented by a dashed line. As in FIGS. 11 and 13, the graph 1500 may show that the BM 715 has constructive interference, and thus peak reflectivity, when the phase of the delay line 720 and the CR 730 overlap.

Figure 16:
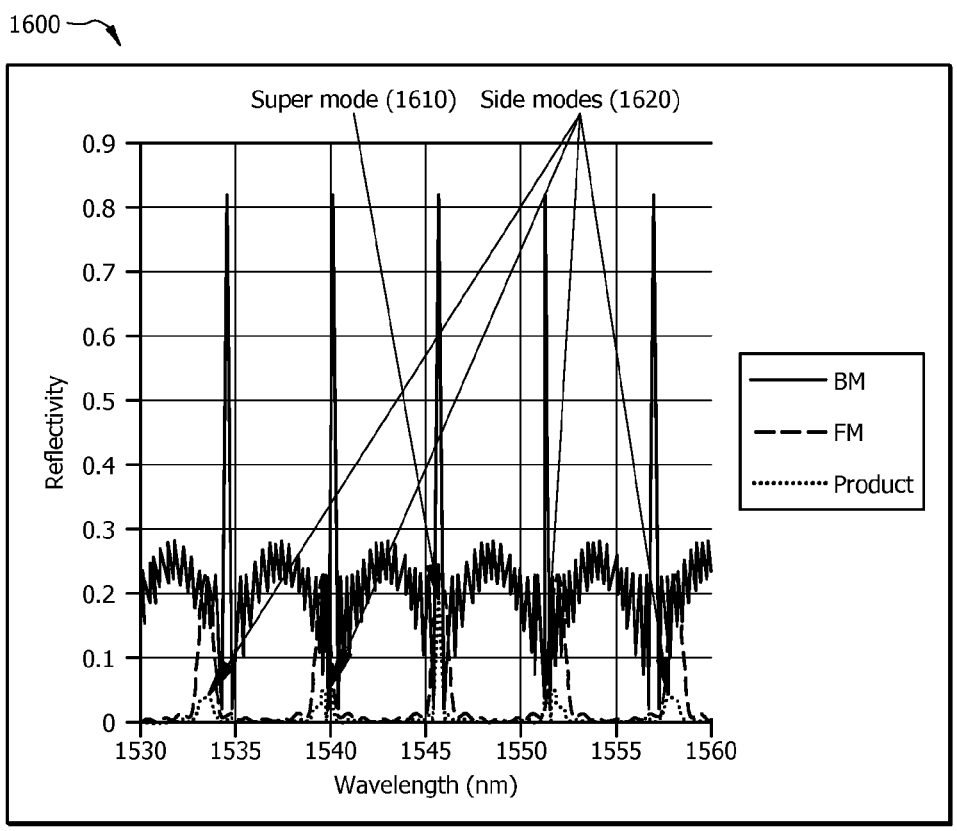
FIG. 16 is a graph of modeled reflectivity spectra for the chip in FIG. 7.

FIG. 16 is a graph 1600 of modeled reflectivity spectra for the chip 700 in FIG. 7. The graph 1600 may account for both the BM 715 and the FM 750, the latter of which may also be a CR. The graph 1600 may be based on the parameters for the FM 750 in Table 4. As shown, the x-axis represents wavelength in nanometers (nm), and the y-axis represents reflectivity as constants or arbitrary units. The reflectivity of the BM 715 is represented by a solid line, the reflectivity of the FM 750 is represented by a dashed line, and the product of the two reflectivities is represented by a dotted line. As shown by the middle maximum representing a super mode 1610 and the other maxima representing side modes 1620, which have significantly less reflectivity than the super mode 1610, the chip 700 may maintain good SMSR.

Figure 17:
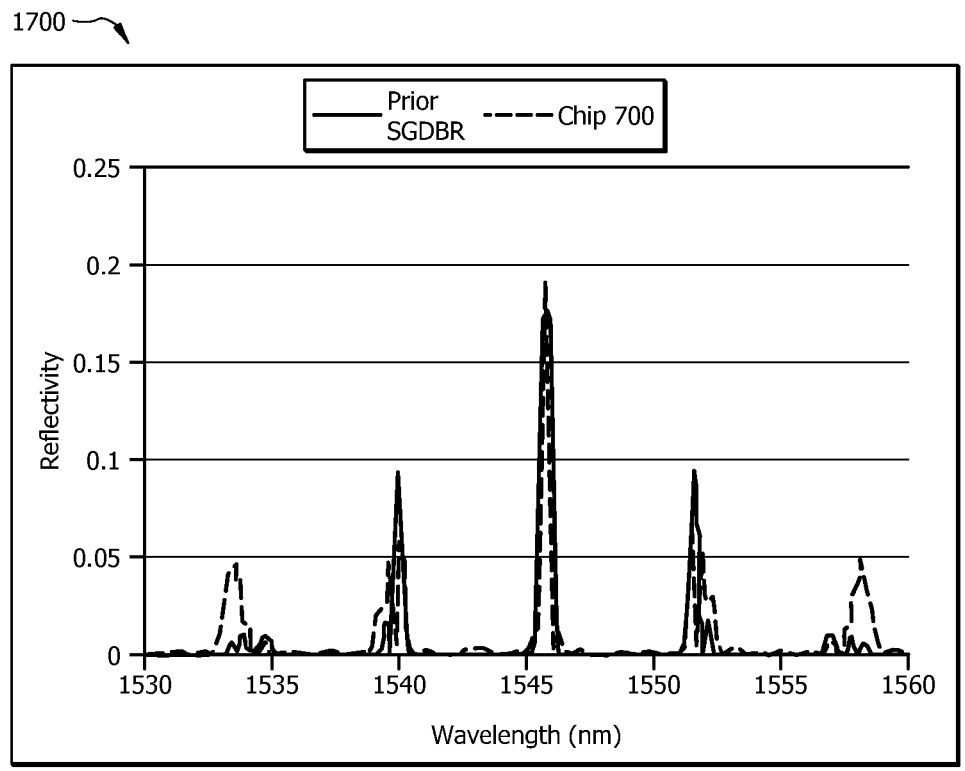
FIG. 17 is a graph comparing modeled reflectivity spectra for a conventional SGDBR and the chip in FIG. 7.
Figure 18:
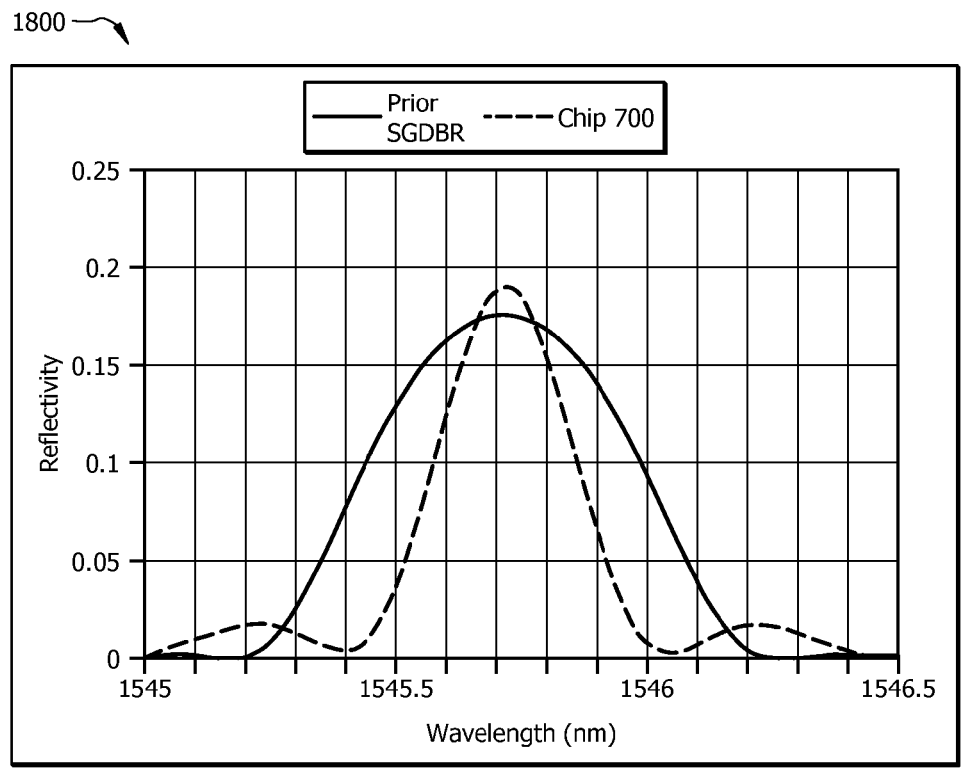
FIG. 18 is a graph of the middle maximum of the reflectivity spectra shown in the graph of FIG. 17.

FIG. 17 is a graph 1700 comparing modeled reflectivity spectra for a conventional SGDBR and the chip 700 in FIG. 7. FIG. 18 is a graph 1800 of the middle maximum of the reflectivity spectra shown in the graph 1700 of FIG. 17. As shown for both FIGS. 17 and 18, the x-axis represents wavelength in nanometers (nm), and the y-axis represents reflectivity as constants or arbitrary units. The reflectivity of the conventional, or prior, SGDBR is represented by a solid line, and the reflectivity of the chip 700 is represented by a dashed line. The reflectivities for both the conventional SGDBR and the chip 700 may represent a combined reflectivity from both a back mirror and a front mirror, specifically the BM 715 and the FM 750 for the chip 700. The CRs for both the conventional SGDBR and the chip 700 may be the same, and the parameters in Tables 2-4 may also be the same. FIGS. 17 and 18 demonstrate that, compared to the conventional SGDBR, the BM 715 in the chip 700 may not degrade the SMSR. In addition, the chip 700 may significantly reduce the cavity reflectivity spectrum width, allowing a longer effective passive section length, which may lead to narrower linewidth.

Figure 19:
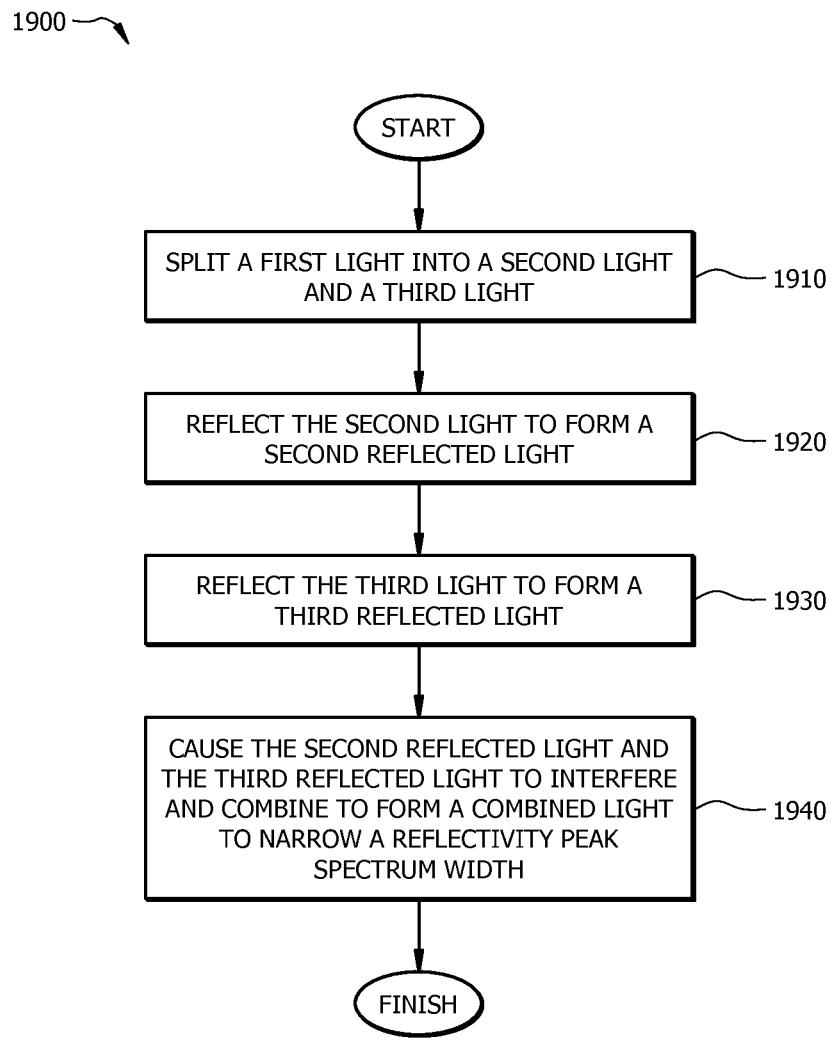
FIG. 19 is a flowchart illustrating a method of narrowing a reflectivity peak spectrum width according to an embodiment of the disclosure.

FIG. 19 is a flowchart illustrating a method 1900 of narrowing a reflectivity peak spectrum width according to an embodiment of the disclosure. The method 1900 may be implemented in the chip 700, particularly in the BM 715, or another suitable device. At step 1910, a first light may be split into a second light and a third light. For instance, the splitter 735 may split the first light into a second light towards the delay line 720 and a third light towards the CR 730. At step 1920, the second light may be reflected to form a second reflected light. For instance, the HR coating 710 may reflect the second light to form the second reflected light. At step 1930, the third light may be reflected to form a third reflected light. For instance, the CR 730 may reflect the third light to form the third reflected light. At step 1940, the second reflected light and the third reflected light may be caused to interfere and combine to form a combined light to narrow a reflectivity peak spectrum width. For instance, the splitter 735 may cause the second reflected light and the third reflected light to interfere and combine to form a combined light to narrow a reflectivity peak spectrum width.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A laser comprising:
   a front mirror (FM);
   a gain section coupled to the FM;
   a phase section coupled to the gain section such that the gain section is positioned between the phase section and the FM; and
   a back mirror (BM) comprising an interferometer and coupled to the phase section such that the phase section is positioned between the BM and the gain section,
   wherein the interferometer comprises a delay line and a first comb reflector (CR) and is configured to cause a first reflected light from the delay line and a second reflected light from the first CR to interfere and combine to:
      form a combined light to narrow a reflectivity peak spectrum width of the BM, and
      allow the laser to emit a laser beam at a selected wavelength.

2. The laser of claim 1, wherein the laser further comprises:
   a back facet comprising high-reflection (HR) coating and coupled to the BM such that the BM is positioned between the back facet and the phase section; and
   a front facet comprising anti-reflection (AR) coating and coupled to the FM such that the FM is positioned between the front facet and the gain section.

3. The laser of claim 1, wherein the FM is a second CR.

4. The laser of claim 1, wherein the interferometer comprises:
   a splitter;
   the delay line coupled to the splitter such that the splitter is positioned between the delay line and the phase section;
   the first comb reflector (CR) coupled to the splitter such that the splitter is positioned between the first CR and the phase section; and
   a terminator coupled to the first CR such that the first CR is positioned between the terminator and the splitter.

5. The laser of claim 4, wherein the splitter is a 1×2 multimode interference (MMI) device.

6. The laser of claim 4, wherein the splitter is a 2×2 multimode interference (MMI) device.

7. The laser of claim 4, wherein the splitter is a directional coupler.

8. The laser of claim 4, wherein the splitter is a Y-branch device.

9. The laser of claim 4, wherein the first CR is a sampled grating distributed Bragg reflector (SGDBR).

10. The laser of claim 4, wherein the first CR is a phase grating distributed Bragg reflector (DBR).

11. The laser of claim 4, wherein the first CR is a ring resonator.

12. The laser of claim 4, wherein the terminator is formed by one of:
   butt-joining of the gain section;
   growing of an absorption material that has high absorption loss when there is no current injection;
   curving a waveguide towards the back facet; and
   terminating the terminator at a distance sufficient to prevent capturing of reflected light from the back facet.

13. A laser comprising:
   a front mirror (FM); and
   a back mirror (BM) indirectly coupled to the FM and configured to:
      split a first light into a second light and a third light;
      reflect, via a first comb reflector (CR), the second light to form a second reflected light;
      reflect, via a delay line and a high-reflection (HR) coating, the third light to form a third reflected light; and
      cause the second reflected light and the third reflected light to interfere and combine to form a combined light to narrow a reflectivity peak spectrum width of the BM and allow the laser to emit a laser beam at a selected wavelength.

14. The laser of claim 13, wherein the selected wavelength is within a C band comprising wavelengths between 1,528 nanometers (nm) and 1,565 nm.

15. The laser of claim 13, wherein the FM is a second CR and is configured to provide reflectivity spectrum maxima tunable by local temperature tuning or current injection tuning.

16. The laser of claim 13, further comprising a gain section coupled to the FM and configured to provide optical gain through current injection.

17. The laser of claim 16, further comprising a phase section coupled to the gain section and configured to:
   align a cavity mode to a peak reflection defined by the BM and the FM; and
   provide fine control of wavelengths through local temperature change or current injection.

18. A method comprising:
   splitting a first light into a second light and a third light;
   reflecting, via a comb reflector (CR), the second light to form a second reflected light;
   reflecting, via a delay line and a high-reflection (HR) coating, the third light to form a third reflected light; and
   causing the second reflected light and the third reflected light to interfere and combine to form a combined light to narrow a reflectivity peak spectrum width.

19. The method of claim 18, further comprising:
   adjusting a phase of the second reflected light prior to causing the second reflected light to interfere and combine; and
   emitting a laser beam within a C band comprising wavelengths at least between 1,528 nanometers (nm) and 1,565 nm.

20. The method of claim 19, further comprising:
   aligning a cavity mode to a peak reflection defined by a back mirror (BM) and a front mirror (FM);
   providing fine control of a wavelength through local temperature change or current injection;
   providing optical gain through current injection; and
   providing reflectivity spectrum maxima tunable by local temperature tuning or current injection tuning.

* * * * *